United States Patent [19]
Adkisson et al.

[11] Patent Number: 6,015,745
[45] Date of Patent: Jan. 18, 2000

[54] METHOD FOR SEMICONDUCTOR FABRICATION

[75] Inventors: James W. Adkisson, Jericho; Jerome B. Lasky, Essex Junction; Paul W. Pastel, Essex; Jed H. Rankin, Burlington, all of Vt.

[73] Assignee: International Business Machines Corporation, Armonk, N.Y.

[21] Appl. No.: 09/080,754

[22] Filed: May 18, 1998

[51] Int. Cl.$^7$ .................................................. H01L 21/76
[52] U.S. Cl. ........................... 438/405; 438/404; 438/424
[58] Field of Search .................................... 438/404, 405, 438/424; 148/DIG. 50

[56] References Cited

U.S. PATENT DOCUMENTS

| | | |
|---|---|---|
| 5,196,373 | 3/1993 | Beasom ..................................... 438/404 |
| 5,258,318 | 11/1993 | Buti et al. . |
| 5,561,073 | 10/1996 | Jerome et al. . |
| 5,637,513 | 6/1997 | Sugiyama . |
| 5,650,354 | 7/1997 | Himi et al. . |
| 5,877,521 | 3/1999 | Johnson et al. .......................... 438/404 |

*Primary Examiner*—Trung Dang
*Attorney, Agent, or Firm*—Scully, Scott, Murphy & Presser; William D. Sabo, Esq.

[57] ABSTRACT

An SOI semiconductor design methodology enables the implementation of simplified STI processes by the design and formation of a shallow trench isolation frame around an electrically active semiconductor region. The simplified STI processes include the fabrication of a trench by phase edge etching, trench sidewall oxidation, TEOS fill, and, finally a chemical or mechanical polish. The attribute which enables the simple process is that all isolation images can be current minimum or near minimum size, specifically no wider than twice the over-lay tolerance of the technology.

6 Claims, 2 Drawing Sheets

METHOD FOR SEMICONDUCTOR FABRICATION

BACKGROUND OF THE INVENTION

1. Field of the Invention

The present invention relates generally to methods for fabricating semiconductor devices, and more particularly, to a technique for isolating active device regions in silicon-on-insulator devices.

2. Discussion of the Prior Art

Silicon-on-insulator ("SOI") is a VLSI semiconductor fabrication technique that provides for the isolation of circuit components, e.g., transistors, from each other. As is well known, this technique is advantageous in terms of enabling production of ICs having increased circuit density, speed and power improvement, immunity from latch-up and improved radiation hardness. Although not specifically drawn to SOI manufacturing techniques, issued U.S. Pat. No. 5,637,513 to Sugiyama, U.S. Pat. No. 5,258,318 to Buti, U.S. Pat. No. 5,650,354 to Himi et al., and, the references cited therein, explain how an SOI semiconductor device may be fabricated. Typically, in SOI, a layer of oxide, usually on the order of 3000 Å, is formed beneath all active device regions.

To isolate active device regions in SOI formed devices, a methodology commonly known as Shallow Trench Isolation ("STI") is implemented. For bulk devices, STI serves several purposes: 1) it electrically isolates devices, and 2) it provides low capacitance when polysilicon conductors "PC" or metallization "MC" runs over isolation between devices. FIG. 1(a) illustrates a photomicrograph depiction of a portion of a semiconductor wafer having formed silicon diffusion areas 20a–20d, localized MC interconnects 14 and PC gates 15 electrically interconnecting devices, e.g., in different diffusion regions 20a and 20b, and contacted over isolation.

FIG. 1(b) illustrates the cross-sectional view of the semiconductor region 10 taken along a portion of line A—A of FIG. 1(a). As shown in FIG. 1(b), PC conductors 15 and local MC interconnects 14 are shown formed within a diffusion region 20. However, it is the case that significantly wide areas of the device, particularly the region 10 formed between active diffusion regions 20a,b, must be formed of STI 12. This necessarily results when polyconductors 15 electrically connect components in two separate diffusion regions. These wide regions of STI, such as shown in FIG. 1(b), may be greater than 5.0 µm wide.

In the known STI semiconductor fabrication techniques, first, a silicon on insulator structure is provided having a conducting layer superjacent the insulator of the SOI. Then, using well known etch techniques, a tapered sidewall trench is formed down to the insulator. Trench widths may range from about 0.3 µm or greater. Typical techniques may include anisotropic etch such as described in U.S. Pat. No. 5,561,073. These trenches may be patterned using a simple nitride (on top of a thin pad oxide) isolation mask, with implementation of either i-line or deep ultraviolet lithography. Third, a $SiO_2$ layer is formed conformally with the sidewalls of the trench of the first and second conductive regions. Fourth, the trench is refilled w/$SiO_2$, preferably by undoped $SiO_2$ such as "TEOS". Oxide coating applied conformally causes build-up or bumps in the area of the conductive region and extra planarization steps are needed to remove this build-up. Thus, after the TEOS deposition, a further etch step is usually required to remove the excess oxide, and finally, a CMP polish is performed to remove all remaining oxide down to the nitride. These steps usually are time-consuming and fairly complicate the otherwise simple, STI formation techniques.

It is readily surmised that the STI trench fabrication techniques as described above is expensive largely due to the extra steps required to achieve device planarization.

Thus, it would be highly desirable to provide an STI etching technique for use with SOI that is simple and cost-effective and that promotes the formation of STI without the time consuming etch-back and/or planarization steps.

Additionally, it would be highly desirable to provide an STI etching technique that promotes the fabrication of trenches using isolation images of minimum or near minimum size.

SUMMARY OF THE INVENTION

An object of the present invention is to provide a technique for isolating active device regions in silicon-on-insulator devices that is simple to perform and requires the use of minimum or near-minimum isolation STI widths.

A further object of the present invention is to provide a technique for isolating active device regions in silicon-on-insulator devices that comprises the formation of a "frame" structure surrounding an silicon active area obviating the need to form wide STI regions for isolating polysilicon or metal conducting overlays connecting two electrically active semiconductor areas.

Still further, it is an object of the present invention to provide a technique for isolating active device regions in silicon-on-insulator devices that enables the formation of isolated polysilicon or metal conducting overlays between two electrical conductive semiconductive regions or "nets" separated by STI trench regions with no imposition or requirement of a minimum width, and, preferably, no greater than the minimum distance of the overlay tolerance for each polysilicon or metal conducting overlay.

Still another object of the invention is to provide an STI frame around each of conductive regions that results in simpler fabrication steps than prior art trench formation methods.

The invention is a semiconductor design methodology which enables the implementation of simplified STI processes comprising the steps of fabricating a trench by etching, trench sidewall oxidation, TEOS fill, and, finally a chemical or mechanical polish. The attribute which enables the simple process is that all isolation images can be minimum or near minimum size, specifically no wider than twice the over-lay tolerance of the technology. Current technology permits maximum STI trench widths of about 0.32 µm or greater, and it is expected that this value will decrease as the technology improves.

In accordance with the preferred aspect of the invention, the methodology comprises the steps of defining a diffusion area capable of containing active semiconductor devices and fabricating an isolation frame around the diffusion area.

Advantageously, the methodology promotes higher density semiconductor device packaging.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Figure 2A:
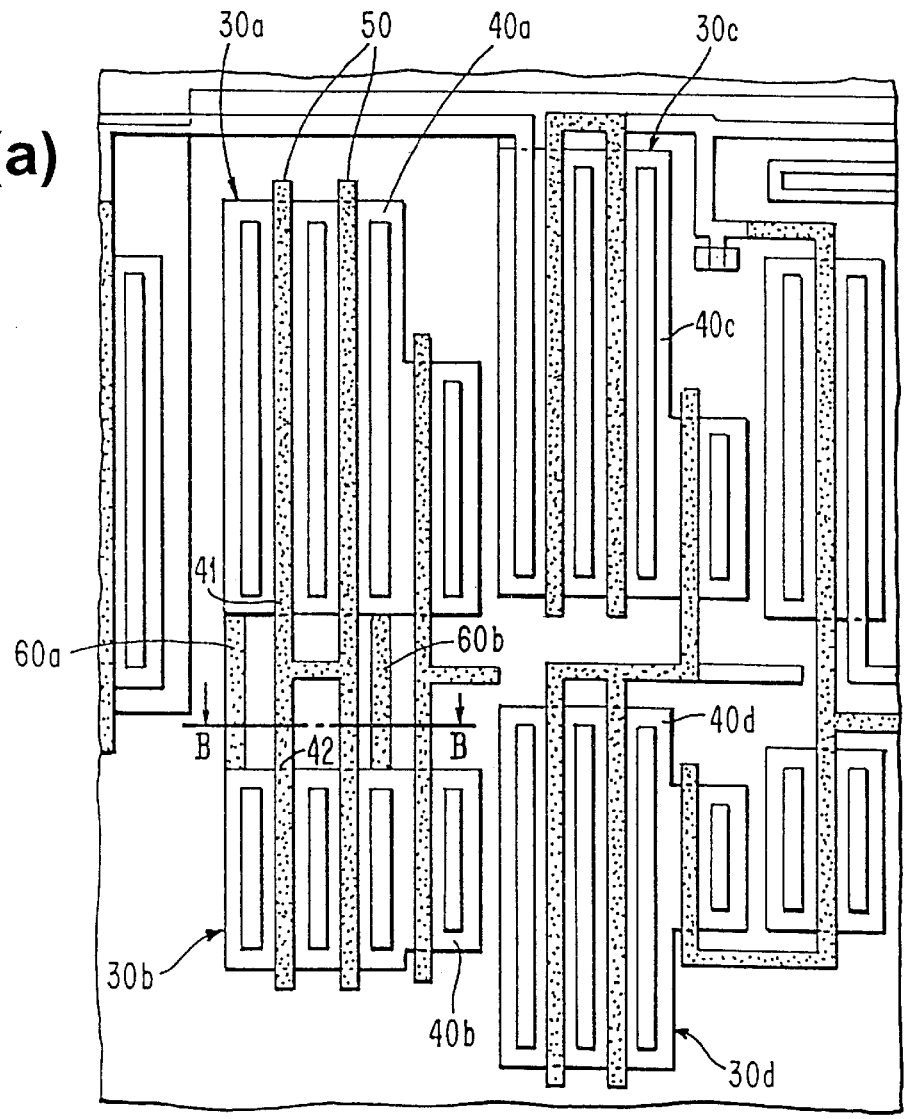
FIG. 2(a) illustrates the semiconductor circuit of FIG. 1(a) formed according to the principles of the present invention.

FIG. 2(a) illustrates a semiconductor SOI device manufactured in accordance with the methodology of the invention. As shown in FIG. 2(a) the semiconductor device 10 comprises the formation of one or more shallow trench "frames", each frame being formed around a predefined diffusion or active semiconductor region for the eventual containment of active and passive semiconductor devices. For instance, as shown in FIG. 2(a), frame 30a is formed around a first active semiconductor region 40a, and a second frame 30b is formed around a second active semiconductor region 40b. FIG. 2(a) shows additional trench frames 30c, 30d formed around respective active regions 40c, 40d. As the method of the invention is intended for use in silicon on insulator (SOI) semiconductor devices, there is no requirement as to the width of the trench forming the frames 30a–30d, so long as the shallow trench frame is formed to contact the buried oxide layer. As no minimum width is required, techniques for defining such a shallow trench 30a include the use phase edge lithography, i.e., implementing the phase edge of a phase shift mask, or dual tone resist which can be used to define sub lithographic openings in resist around the active regions 40a–40d. In the preferred embodiment, frame widths generally range between 0.1 μm and 0.2 μm wide, and are usually no greater than 0.32 μm. The techniques for manufacturing the trench are such as described above, and include etch through pad nitride and silicon to the underlying oxide layer (SOI), normally about 0.18 μm deep, sidewall oxidation and TEOS deposit and, finally, a chemical/mechanical polish to the nitride layer.

In semiconductor device manufacturing technology, polysilicon conducting layers are formed to interconnect semiconductor devices located in different diffusion regions. For example, as shown in FIG. 2(a), one or more polysilicon conducting layers 50 may be fabricated to provide a common gate for different CMOS transistor devices located in silicon diffusion regions 40a and 40b. As shown in FIG. 2(a), the PC gates, e.g., gate 50a, are manufactured directly over frame trenches 30a and 30b, at locations labeled 41 and 42, for respectively connecting devices provided in silicon diffusion regions 40a and 40b.

Figure 2B:
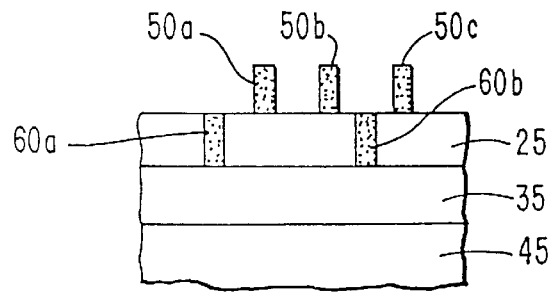
FIG. 2(b) illustrates a cross sectional view of the circuit taken along the line B—B of FIG. 2(a).

As shown in FIG. 2(b) illustrating the cross-sectional view of the device taken along line B—B of FIG. 2(a), the PC gate layers 50a and 50b are fabricated by conventional fabrication techniques atop the silicon layer 25 superjacent the oxide layer 35 with silicon substrate 45 therebeneath. As these gates are formed atop silicon, and typically at different electrical potentials, isolation of electrically connected nets such as polysilicon or metal from any other net, is required. It should be understood that any element of one net is allowed to over-lay multiple silicon islands (frame-bound active regions), whether they be active or inactive islands, as long as no two nets contact or over-lay the same silicon islands. Thus, those PC gates connected together, such as gates 50a,b in FIG. 2(a), are at the same electrical potential and need not be electrically isolated. However, gate 50c needs to be electrically isolated from the other PC gates 50a and 50b as it may very well be at a different potential.

Thus, in accordance with the method of the invention, each gate 50a,b and c need not run over broad STI regions, with the extra etch-back and planarization steps as required in the prior art. All that is required is the formation of separate STI isolation trenches 60a and 60b to separate such active polysilicon or metal conducting layers, i.e., "nets". As shown in FIG. 2(a), each STI trench 60a and 60(b) is formed to extend between a first frame, e.g., frame 30a separating diffusion region 40a, and a second frame, e.g., frame 30b separating diffusion region 40b, in order to isolate the first net comprising conductors 50a and 50b interconnecting elements in diffusion layers 40a and 40b, and the second net comprising conductor 50c interconnecting other elements in diffusion layers 40a and 40b. As shown in the cross-sectional view of FIG. 2(b), each STI trench 60a and 60(b) is formed deep enough to contact the oxide layer 35, which using conventional processes, may be between the order of about 0.05 μm to about 0.3 μm deep and about 0.1 μm to about 0.4 μm wide. Thus, as shown in FIG. 2(b), STI trench 60a isolates the conducting PC gates 50a and 50b from other electrically active areas, and STI trench 60b isolates the conducting PC gates 50a and 50b from other electrically active areas. As a practical matter, regions may have to be defined by chrome on the phase shift mask to isolate different nets, in what would normally be the STI region and can be the minimum printable image size.

It should be understood that, in the diffusion regions, the capacitance of such gate layers 50 will be low because the diffusion sits over 3000 Å oxide layer 35 and hence has low capacitance to substrate. The only requirement is that the diffusion areas that the gates 50 touch are electrically isolated from each other, for example, by frames 30a, . . . , 30d.

In accordance with the principles of the invention, exclusively thin frames of isolation can be formed on the wafer. In some places the frame may need to be wider than the minimum that can be defied by dual tone resist or phase edge mask techniques, but it should always be possible to have the width no larger than twice the over-lay tolerance for the technology.

Figure 1A:
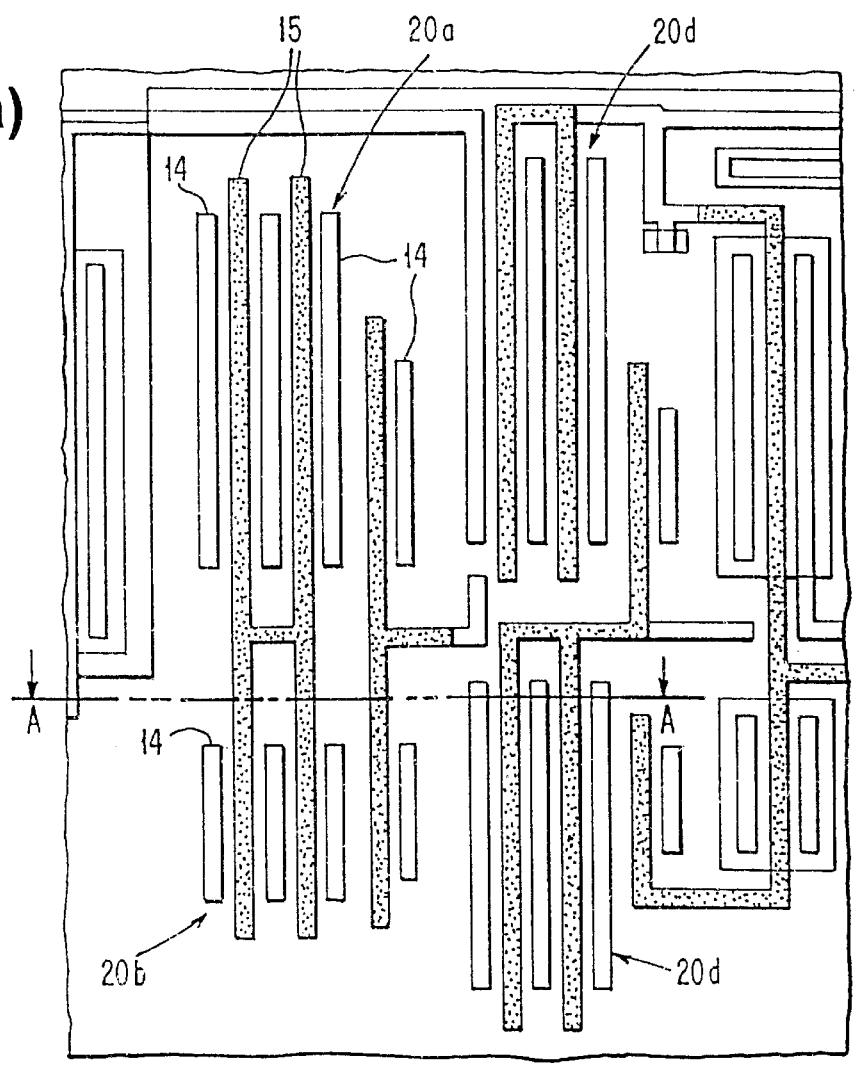
FIG. 1(a) is a photomicrograph depiction of a semiconductor device containing semiconductor diffusion regions isolated by wide STI trenches formed by conventional STI isolation techniques.
Figure 1B:
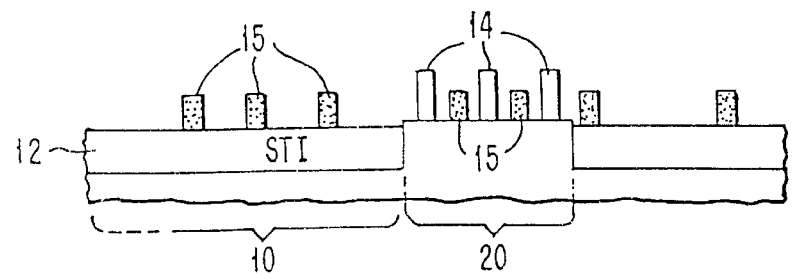
FIG. 1(b) is a cross sectional view along line A—A of FIG. 1(a) showing isolated PC interconnect overlays formed a top the wide STI trenches formed in accordance with conventional STI isolation techniques.

With only very narrow STI isolation regions formed, the STI process is greatly simplified because there is no need for an intermediate planarization step. All that is required is a simple trench etch, deposition of oxide, and a CMP (chemical) polish. If a phase edge or dual tone resist method is able to define 0.1 um wide STI, there could be a 3.5:1 aspect ratio to the STI and an HDP oxide may be required to fill this. Thus, the formation of frame trenches 30a–30d obviates the need for wide STI regions necessary when running interconnects and PC overlays, such as found in region 10 of FIG. 1(b), between active diffusion regions. Since PC and interconnects do not have to be formed on wide isolation trenches, such extra etch-back and planarization steps found in prior art STI fabrication techniques (FIG. 1(b)), are no longer necessary.

While the invention has been particularly shown and described with respect to illustrative and preformed embodiments thereof, it will be understood by those skilled in the art that the foregoing and other changes in form and details may be made therein without departing from the spirit and scope of the invention which should be limited only by the scope of the appended claims.

Having thus described our invention, what we claim as new, and desire to secure by Letters Patent is:

1. A method for simplified processing of semiconductor devices having a semiconducting layer formed a top a layer of insulating semiconductor, said method comprising:

defining one or more areas capable of forming electrically active semiconductor regions on said layer of insulating semiconductor;

forming a shallow trench frame of electrically insulating material around a corresponding defined electrically active semiconductor region, each said shallow trench frame having insulating material connecting said layer of insulating semiconductor and dimensioned to electrically isolate each said electrically active semiconductor region of said semiconducting layer;

forming one or more electrically conducting layers interconnecting different electrically active components in a first frame enclosed semiconductor region and a second frame enclosed semiconductor region, each said one or more electrically conducting layers formed on said semiconducting layer extending between said first and second frame regions; and, forming one or more shallow trenches of electrically insulating material in said semiconducting layer between said first and second frame regions, each said shallow trench having insulating material connecting said layer of insulating semiconductor and extending between said first frame and second frame to ensure electrical isolation of each said electrically conducting layers between said first and second frame regions, whereby a process for manufacturing said shallow trenches is simplified.

2. A method as claimed in claim 1, wherein said shallow trench frame is formed by phase edge lithography.

3. A method as claimed in claim 1, wherein said shallow trench frame is of a width no larger than twice an over-lay tolerance of a phase edge lithographic technique.

4. A method as claimed in claim 1, wherein said shallow trench frame is less than or equal to about 0.32 $\mu$m in width.

5. A method as claimed in claim 1, wherein each said one or more shallow trenches of electrically insulating material in said semiconducting layer between said first and second shallow trench frame is less than or equal to about 0.32 $\mu$m in width.

6. A method as claimed in claim 1, wherein said process for forming said shallow trench comprises the steps of:

etching an area of said semiconductor layer at a depth equal to said insulating semiconductor layer, said trench having sidewalls;

depositing an oxide liner on each said trench sidewalls;

conformally depositing insulating material in remaining regions of said trench; and polishing said trench region by chemical polish to planarize said trench region.

* * * * *